United States Patent [19]

Yamaguchi et al.

[11] Patent Number: 4,792,693

[45] Date of Patent: Dec. 20, 1988

[54] STEP-AND-REPEAT EXPOSURE METHOD

[75] Inventors: Atsushi Yamaguchi, Chigasaki; Sinichi Hasegawa, Yokohama, both of Japan

[73] Assignee: Nikon Corporation, Tokyo, Japan

[21] Appl. No.: 157,127

[22] Filed: Feb. 10, 1988

Related U.S. Application Data

[63] Continuation of Ser. No. 906,744, Sep. 12, 1986, abandoned.

[30] Foreign Application Priority Data

Sep. 19, 1985 [JP]  Japan .................................. 60-207276

[51] Int. Cl.[4] ............................................. G01B 11/27
[52] U.S. Cl. ..................................... 250/548; 356/401
[58] Field of Search ............................... 250/548, 557; 356/399–401; 364/559, 490–491

[56] References Cited

U.S. PATENT DOCUMENTS

| | | | |
|---|---|---|---|
| 4,395,117 | 7/1983 | Suzuki | 250/557 |
| 4,636,626 | 1/1987 | Hazama et al. | 250/557 |
| 4,662,753 | 5/1987 | Yabu | 250/548 |
| 4,677,301 | 6/1987 | Tanimoto et al. | 250/548 |

Primary Examiner—Edward P. Westin
Attorney, Agent, or Firm—Shapiro and Shapiro

[57] ABSTRACT

In a step-and-repeat exposure method, an alignment error does not influence accuracy of a shot arrangement on a photosensitive substrate. An amount corresponding to an alignment error of a reticle with respect to the apparatus is detected, a position as an origin of an x-y stage for moving a photosensitive substrate is corrected by the detected amount, and a step-and-repeat exposure is then performed using the reticle.

4 Claims, 4 Drawing Sheets

F I G. 5
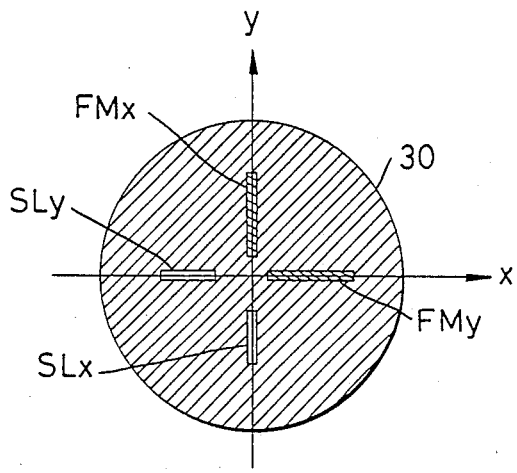
F I G. 6
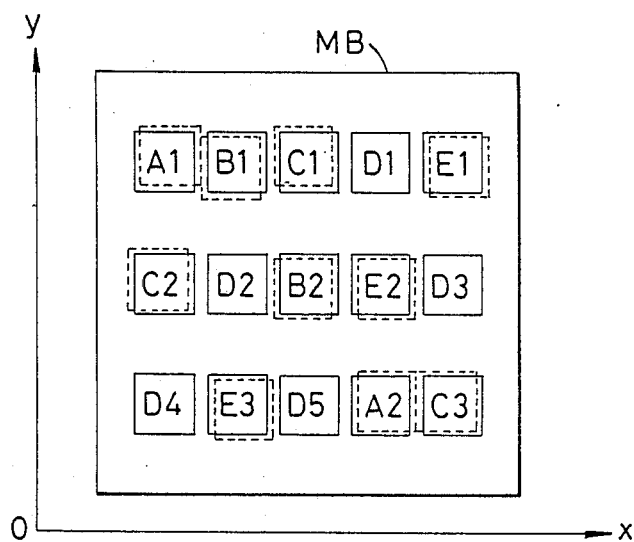

STEP-AND-REPEAT EXPOSURE METHOD

This is a continuation application of Ser. No. 906,744, filed Sept. 12, 1986, now abandoned.

BACKGROUND OF THE INVENTION

1. Field of the Invention

The present invention relates to a step-and-repeat exposure method and, more particularly, to an exposure method suitable for replacing reticles serving asmmasks during exposure of a plurality of shots on a photosensitive substrate.

2. Related Background Art

A conventional working mask, used with a proximity exposure apparatus or a projection exposure apparatus which has a magnification of one, has a plurality of circuit patterns arranged in a matrix form, and each circuit pattern corresponds to a single device chip. A reticle having an original image pattern enlarged 5 or 10 times the circuit patterns of one or a few chips is used to prepare the working mask. The reticle is mounted on a step-and-repeat exposure apparatus or a so-called photorepeater having a projection lens with a reduction ratio of 1/10 or 1/5. A mask blank (glass substrate) applied with a photosensitive agent is placed on an x-y stage of the photorepeater. The x-y stage is stepped in x and y directions to sequentially expose reduced images of 1/10 or 1/5 for the original image pattern on different areas on the mask blank.

In the photorepeater, unlike a wafer stepper, since an overlapping exposure is not performed basically, accuracy of a chip arrangement of the resultant working mask depends largely on stepping accuracy of the x-y stage. This also applies to the case wherein a first layer exposure (first print) is performed in the wafer stepper. This means that a working mask with high accuracy of a chip arrangement can be formed as long as stepping accuracy of the x-y stage is good.

However, chips including marks for mask alignment and chips including patterns for a test circuit different from those of real elements are often formed in the working mask in addition to chips including circuit patterns. This means that replacement of a plurality of reticles is required to expose a single mask blank.

This replacement of reticles often degrades accuracy of a chip arrangement in a single working mask. This is because an absolute alignment error of a reticle with respect to an exposure apparatus main body occurs after replacement. More specifically, an absolute positional difference between reticles before and after replacement directly influences accuracy of the chip arrangement. This will be described with reference to FIG. 6 which shows a shot arrangement on a mask blank MB. FIG. 6 illustrates a case wherein five reticles having different original image patterns A, B, C, D and E are replaced and exposed.

First, the reticle having the original pattern D is aligned on the apparatus using a predetermined reticle alignment optical system. According to design shot arrangement data (shot address), an x-y stage is positioned at each exposure position with reference to an origin O of an orthogonal coordinate system x-y. Positions are measured by a laser interferometric measuring device with accuracy of 0.02 μm. Then, shots $D_1$, $D_2$, $D_3$, $D_4$ and $D_5$ are sequentially exposed.

Next, the reticle is replaced with the one having the original image pattern E, which is aligned on the apparatus. Similarly, shots $E_1$, $E_2$ and $E_3$ are sequentially exposed according to the shot address. In this case, since the origin serving as the reference of movement of the x-y stage remains the same as that of the previous reticle, shots $E_1$, $E_2$ and $E_3$ are performed as illustrated by solid lines so long as the reticle after replacement has no alignment error. However, when an alignment error occurs, shots $E_1$, $E_2$ and $E_3$ are deviated from the designed shot arrangement as illustrated by broken lines.

Thereafter, when the reticles having the original image patterns A, B and C, respectively, are exposed, shots $A_1$, $A_2$, $B_1$, $B_2$, $C_1$, $C_2$ and $C_3$ are respectively deviated from designed shots arrangement as illustrated by broken lines because an alignment error of each reticle occurs. As described above, accuracy of a chip arrangement of the resultant working mask is degraded by an alignment error which occurs when a reticle is replaced.

SUMMARY OF THE INVENTION

It is an object of the present invention to provide a step-and-repeat exposure method wherein an alignment error does not influence accuracy of a shot arrangement on a photosensitive substrate.

In the step-and-repeat exposure method according to the present invention, an amount corresponding to an alignment error of a reticle with respect to the apparatus is detected, a position as an origin of an x-y stage for moving a photosensitive substrate is corrected by the detected amount, and a step-and-repeat exposure is then performed using the reticle.

According to the present invention, shots to be arranged on the photosensitive substrate are arranged with accuracy depending on stepping accuracy of the stage, and accuracy of a shot arrangement is not degraded by an alignment error of the reticle with respect to the apparatus. Therefore, especially in a photorepeater or the like wherein a plurality of reticles are replaced and exposed for a single photosensitive substrate, accuracy of the resultant working mask is significantly improved. When a plurality of working masks are used for an overlapping exposure, overlapping accuracy of each chip formed on the wafers is improved and yield of fabricated chips is increased.

The present invention is also effective in a step-and-repeat exposure wherein a local area of each chip and an area adjacent to each chip on a wafer are sequentially exposed by first and second photomasks, respectively, to obtain a composite image of a group of chips.

BRIEF DESCRIPTION OF THE DRAWINGS

FIG. 5 is a plan view showing a shape of a slit plate in the apparatus in FIG. 4; and FIG. 6 is a plan view for explaining shot arrangement error on a mask blank exposed by a conventional photorepeater.

DETAILED DESCRIPTION OF THE PREFERRED EMBODIMENTS

Figure 1:
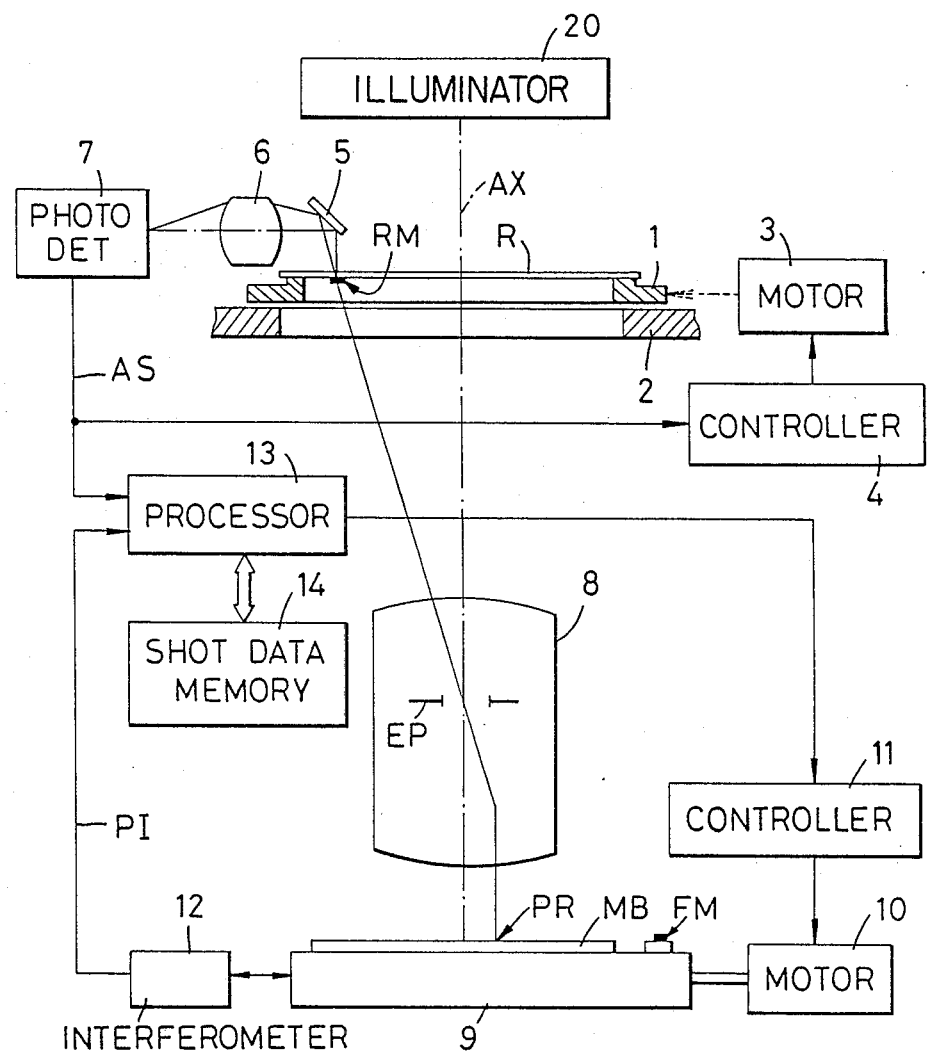
FIG. 1 is a schematic view of a step-and-repeat exposure apparatus employed according to a first embodiment of the present invention.

FIG. 1 shows a schematic arrangement of exposure apparatus employed according to the first embodiment of the present invention. A reticle R having a mark RM for alignment in addition to a predetermined circuit pattern is placed on a reticle stage 1 which is provided to be movable in x and y directions with high precision on a column 2. The reticle stage 1 is moved by a motor 3 which is driven by a controller 4. Above the mark RM of the reticle R, a reticle alignment microscope consists of a mirror 5, an objective lens 6, and a photodetector 7 having a predetermined detection center. The reticle alignment microscope is fixed to the exposure apparatus. The photodetector 7 outputs an alignment signal AS corresponding to a deviation of an image of the mark RM from the predetermined detection center. The controller 4 receives the alignment signal AS to servo-drive the motor 3 so that a difference between the mark RM and the predetermined detection center is set to be zero.

An image of the circuit pattern of the reticle R is formed on a mask blank MB by a projection lens 8 having an entrance pupil EP and an optical axis AX perpendicular to the reticle R. The mask blank MB is mounted on a stage 9 which is moved two-dimensionally in x and y directions by a motor 10. The stage 9 is also moved finely for focusing in a z direction (along the optical axis). The motor 10 is driven by a stage controller 11. A fiducial mark FM having the same shape as that of the mark RM on the reticle R is provided on the stage 9. The fiducial mark FM is detected by the photodetector 7 just the same way as in the case with the mark RM when it is positioned to coincide with a projection point PR of the detection center of the reticle alignment microscope.

A two-dimensional position (coordinate data) of the stage 9 is detected by a laser interferometric measuring device (to be referred to as an interferometer) 12 and its position information PI is output to a processor 13 including a computer.

A shot data memory 14 in which coordinate data of all shots to be exposed on the mask blank MB is stored is connected to the processor 13. During step-and-repeat exposure, the processor 13 reads out position data of shots from the memory 14 and outputs a control signal corresponding to the position data to servo-drive the stage 9. The processor 13 also outputs a control signal to the stage controller 11 for moving the stage 9 to a given position. In addition, in order to detect an amount corresponding to an alignment error of the reticle R, the processor 13 receives the alignment signal AS and has a function of performing arithmetic operations for correcting a position serving as an origin for shots.

In this embodiment, the alignment error of the reticle R is indirectly obtained by detecting a drift of the reticle alignment microscope, i.e., a deviation of the detection center from the exposure apparatus as a factor of alignment error. An operation of the embodiment will be described below with reference to the flow chart in FIG. 2. In this embodiment, a case will be explained wherein two reticles are used for exposure for the sake of simplicity; however, two or more reticles can be used to obtain the same result (Step 1)

A first reticle R is placed on the reticle stage 1 and aligned coarsely at a predetermined position by the controller 4 and the motor 3. In this prealignment, the reticle R is positioned so that the mark RM falls slightly outside the detection field of the reticle alignment microscope. More specifically, the reticle R is positioned such that the reticle alignment microscope can detect an object positioned on an image plane of the projection lens 8 through a transparent portion at a periphery of the mark RM.

(Step 2)

The processor 13 drives the stage controller 11 and the motor 10 to position the stage 9 so that the fiducial mark FM is aligned with the projection point PR of the reticle alignment microscope. A position of the projection point PR in a stage moving coordinate system is known as design information in advance because the reticle alignment microscope is fixed in position When the fiducial mark FM falls within the detection field of the reticle alignment microscope, the processor 13 reads an alignment signal AS to servo-control the motor 10 for positioning the stage 9 precisely such that the detection center coincides with the fiducial mark FM.

When the processor 13 detects that the alignment signal AS goes to zero (or a level within a predetermined range including zero) representing alignment accomplishment during reading of the signal, the processor 13 reads out coordinate data ($RX_1$, $RY_1$) of the stage 9 at this time from the position information PI from the interferometer 12 and stores it. The coordinate data ($RX_1$, $RY_1$) is a projection position of the detection center of the reticle alignment microscope in the stage moving coordinate system and is measured with accuracy (0.02 $\mu$m) corresponding to a resolving power of the interferometer 12. Note that since the reticle alignment microscope is fixed to the exposure apparatus, it must be adjusted so as not to have a drift with respect to an absolute position. However, by factors such as temperature changes and airflow in an optical path which influence the optical characteristics, the detection center of the reticle alignment microscope often drifts with respect to the absolute position. In this case, the coordinate data ($RX_1$, $RY_1$) includes the drift of the reticle alignment microscope.

(Step 3)

Figure 3:
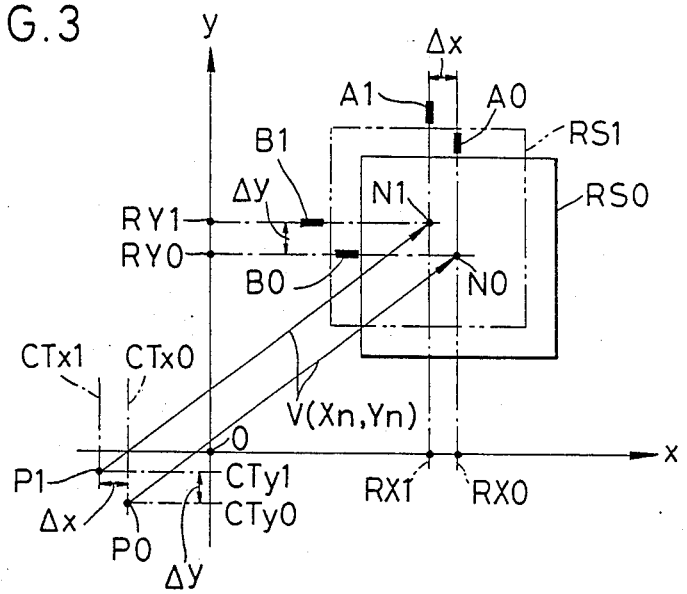
FIG. 3 is a diagram showing correction of an origin.

The processor 13 corrects the position serving as the origin of the stage 9 during step-and-repeat exposure. In this case, the origin is not corrected mechanically, but the coordinate data stored as the origin is calculated and corrected. This will be described with reference to FIG. 3. In FIG. 3, the coordinate system xy is a moving coordinate system of the stage 9 defined by the interferometer 12, and its mechanical origin is O. In FIG. 3, a shot area $RS_1$ by the first reticle R has a center $N_1$, and the reticle alignment microscope has detection centers $A_1$ and $B_1$ when the reticle R is aligned.

Two detection centers are present in FIG. 3; however, this arrangement is impossible with only a single reticle alignment microscope as shown in FIG. 1. FIG. 3 illustrates the detection centers for the sake of simplicity. Of course, two reticle alignment microscopes may be arranged as shown in FIG. 3. However, if the mark RM or the fiducial mark on the reticle has a cross shape and the photodetector 7 has detection centers in two directions so as to detect positional deviations of the cross mark in x and y directions, a single reticle alignment microscope need only be used as shown in FIG. 1.

In FIG. 3, the detection center $A_1$ is used for alignment of marks RM and FM in the x direction, and the detection center $B_1$ is used for alignment of marks RM and FM in the y direction. In FIG. 3, the x coordinate $RX_1$ of the detection center $A_1$ and the y coordinate $RY_1$ of the detection center $B_1$ are illustrated such that they coincide with a projection center of the reticle R, i.e., a position of a shot $N_1$. However, this is not necessary.

In FIG. 3, detection centers $A_0$ and $B_0$ represent ideal absolute positions when no drift occurs in the reticle alignment microscope. A shot area $RS_0$ by the reticle aligned at this time has a shot center $N_0$. Absolute coordinate data of the detection centers $A_0$ and $B_0$ with no drift is represented by $(RX_0, RY_0)$ The coordinate data $(RX_0, RY_0)$ can be defined theoretically. However, in an actual apparatus, only the coordinate data $(RX_1, RY_1)$ can be measured because whether the reticle alignment microscope drifts cannot be known directly.

Assume that the deviation from the detection center by the drift is $(-\Delta x, \Delta y)$. Since the origin of the stage during step-and-repeat exposure is determined as the coordinate data fixed on the coordinate system xy in a conventional photorepeater, when position data V $(X_n, Y_n)$ of a certain shot with respect to the origin is given, the stage 9 is positioned at the position $N_0$ irrespective of the amount of drift $(-\Delta x, \Delta y)$. For this reason, shots are arranged on the mask blank so that they are deviated from the absolute positions by the amount of drift $(-\Delta x, \Delta y)$. Therefore, in this embodiment, the coordinate data $CT_{x1}, CT_{y1})$ of the origin $P_1$ is defined by the difference between the coordinate data $(RX_1, RX_2)$ of the detection centers $A_1$ and $B_1$ and fixed constant values (constants) CONSTx and CONSTy, as follows:

$$CT_{x1} = RX_1 - CONSTx \ldots \quad (1)$$

$$CT_{y1} = RY_1 - CONSTy \ldots \quad (2)$$

where CONSTx and CONSTy are determined to given values, e.g., the amount of drift.

When the origin of the stage is defined as equations (1) and (2) described above, the coordinate data $(CT_{x0}, CT_{y0})$ of the origin $P_0$ with no drift is determined as given by the following equations (3) and (4):

$$CT_{x0} = RX_0 - CONSTx \ldots \quad (3)$$

$$CT_{y0} = RY_0 - CONSTy \ldots \quad (4)$$

where the relationship between $(RX_1, RY_1)$ and $(RX_0, RY_0)$ is given as $RX_1 = RX_0 - \Delta x$, $RY_1 = RY_0 + \Delta y$ by the drift $(-\Delta x, \Delta y)$, and the origin $P_1$ is corrected by the amount of drift $(-\Delta x, \Delta y)$ with respect to the origin $P_0$ with no drift. Therefore, since the shots on the mask blank MB are arranged in the position $(X_n, Y_n)$ with respect to the corrected origin $P_1$ regardless of the drift, no absolute positional deviation occurs on the mask blank MB.

(Step 4)

After the origin of the stage is defined, the reticle stage 1 is servo-controlled according to the alignment signal AS so that the mark RM coincides with the detection center of the reticle alignment microscope. At this time, the fiducial mark FM falls outside the detection field, the reticle stage 1 is accurately aligned and then drawn to the column 2 by vacuum suction and fixed to the apparatus main body.

(Step 5)

The processor 13 reads out shot position data V $(X_n, Y_n)$. The data is stored as a distance with reference to the origin (the origin defined in the step 3) of the stage 9 during step-and-repeat exposure Then, the processor 13 adds the shot data V with the origin $P_1$ and determines the shot position (exposure position). When the shot position $C_n$ to be obtained is represented by the coordinate data $(C_{xn}, C_{yn})$, it is determined by the following equations (5) and (6):

$$C_{xn} = CT_{x1} + X_n \ldots \quad (5)$$

$$C_{yn} = CT_{y1} + Y_n \ldots \quad (6)$$

where the suffix n denotes an address of a shot.

(Step 6)

The processor 13 servo-controls the motor 10 through the stage controller 11 to position the stage 9 so that the position information PI from the interferometer 12 coincides with the shot position $C_n$. Then, light from an illuminating unit 20 illuminates the reticle R, and a circuit pattern image is exposed (printed) on the mask blank MB at the shot position $C_n$.

It is then determined, whether the next shot to be exposed by the first reticle is present, and if the residual shot is present, the process returns to the previous step 5 and exposure is repeated by the same sequence. Repetition of steps 5 and 6 is a fundamental control process of the so-called step-and-repeat exposure.

When all shots by the first reticle are completed, whether the reticle is replaced with the next one is determined. Since the second reticle is used in this embodiment, the first reticle is removed from the stage and the second reticle is placed on the reticle stage 1.

Thereafter, the same sequence is executed from the previous step 1. Note that the coordinate system x-y defined by the interferometer 12 is held in the same condition as that during the first reticle exposure after the reticle is replaced. Exposure by the second reticle is performed in the area not exposed by the first reticle or in the same shot area. The shot arrangement error caused by the drift of the reticle alignment microscope is so small that it is practically negligible.

Figure 4:
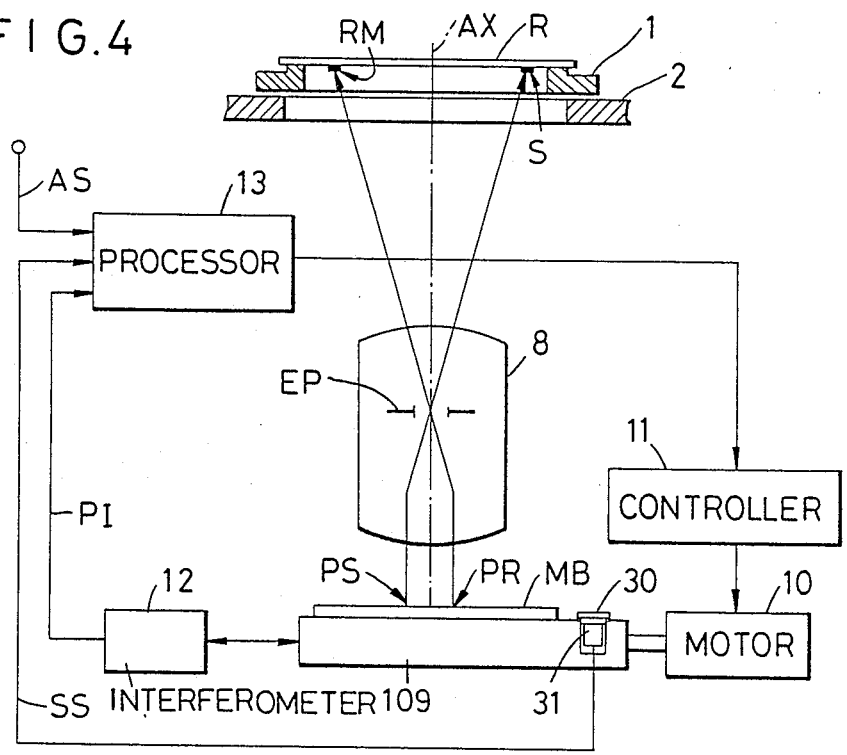
FIG. 4 is a schematic view of an essential part of the exposure apparatus employed according to a second embodiment of the present invention.

As described above, in the first embodiment, the origin is defined as the difference between the detection center $(RX_1, RX_2)$ of the reticle alignment microscope and the constant value (CONSTx, CONSTy), thereby correcting influence of the drift of the detection center. However, when the origin is obtained as a sum of the detection center $(RX_1, RX_2)$ and the constant value (CONSTx, CONSTy), the same result can be obtained A schematic configuration of the exposure apparatus employed according to a second embodiment of the present invention will now be described with reference to FIG. 4. A difference between this embodiment and the first embodiment is that a slit plate 30 having a surface coincident with the image plane of the projection lens 8 is provided on a stage 109 and that a photoelectronic element 31 is arranged below the slit plate 30. The slit plate 30 has slits $SL_y$ and $SL_x$ extending in x and y directions respectively, and the light is received by the photoelectronic element 31 through the slits $SL_y$ and $SL_x$. Fiducial marks $FM_x$ and $FM_y$ for measuring a detection center position of the reticle alignment microscope are also formed on the slit plate 30.

A slit-like mark s which can be detected by the slits $SL_y$ and $SL_x$ is formed at a periphery of a circuit pattern of the reticle R. The stage 109 is moved by the slit 30 and the photoelectronic element 31 to scan a projected image of the mark S (or the mark RM) formed on the reticle R, thereby detecting the projection position $P_s$ (or $P_r$) of the mark S (or RM). Since a detection method is disclosed in detail in U.S. Ser. No. 800,094, filed on Nov. 20, 1985, a description will be omitted here.

When the photoelectronic slits are provided on the stage 109 in the manner described above, an alignment error of the reticle R can be directly detected. Of the alignment errors, an error by the drift of the reticle alignment microscope is corrected sufficiently in the first embodiment. However, an alignment error occurring during a fixing process (reticle alignment) wherein the detection center of the reticle alignment microscope is aligned accurately with the mark RM to fix the reticle R to the exposure apparatus is included in the alignment errors. This error cannot be removed in the first embodiment; however, this embodiment can remove it. The procedure for this will be described briefly below.

Figure 2:
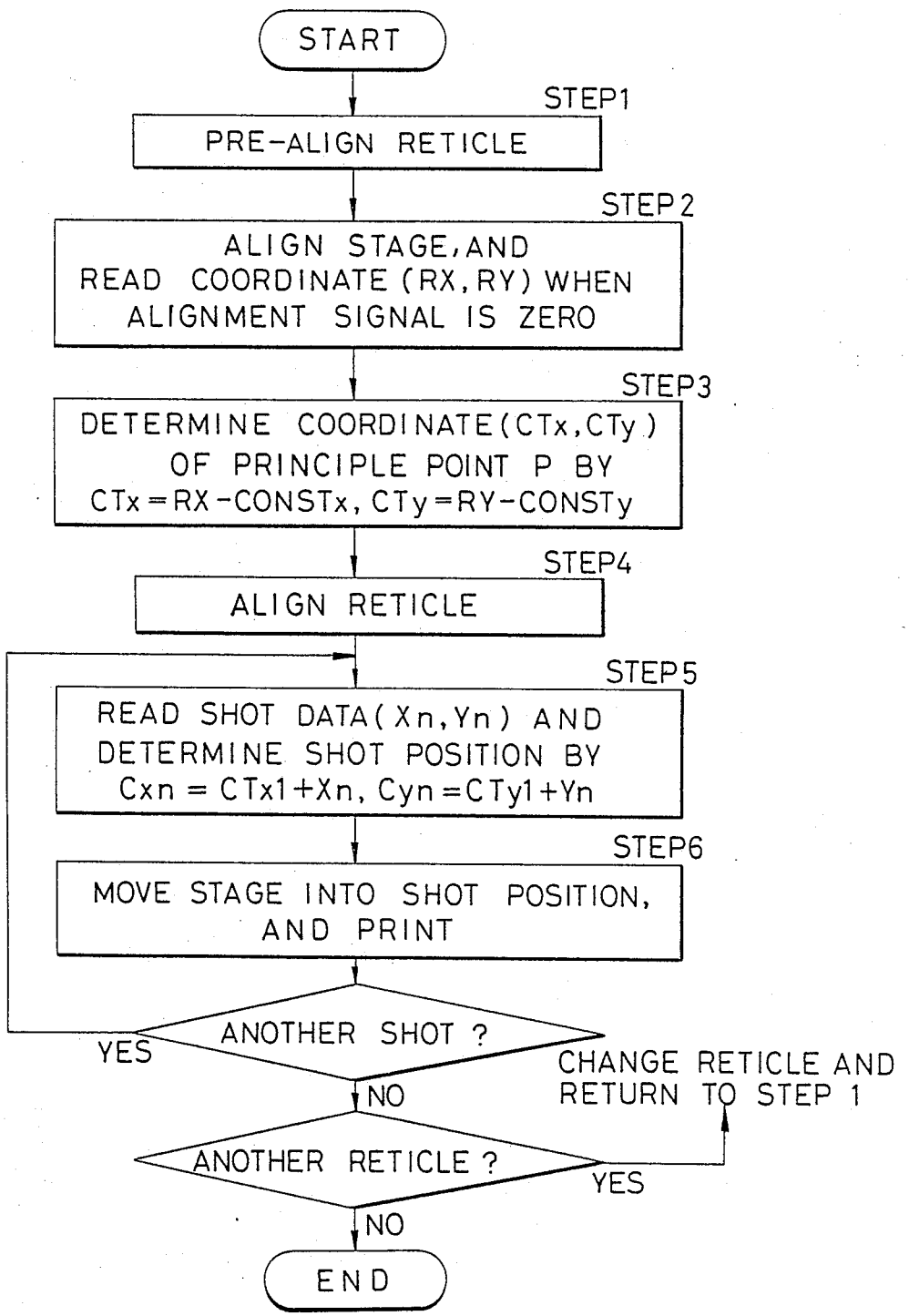
FIG. 2 is a flow chart for explaining an operation of the apparatus in FIG. 1.

A difference between this procedure and the flow chart of the first embodiment shown in FIG. 2 is only that a projection position of the mark S of the reticle R is measured using the photoelectronic slits $SL_x$ and $SL_y$ and the origin is corrected more accurately during "reticle alignment" of step 4. Normally, when the reticle R is positioned and servo-locked by the motor 3 according to the alignment signal AS so that the level of the signal is set to be zero, an alignment error between the detection center of the reticle alignment microscope and the mark RM can be so small as to be practically negligible. However, when the reticle stage 1 is drawn to the column 2 by vacuum suction, the reticle stage 1 is often deviated in an x or y direction by a small amount.

Therefore, with the reticle R servo-locked according to the alignment signal AS, the stage 109 is moved and the projected image of the mark S is detected by the photoelectronic slits $SL_y$ and $SL_x$, and its position $P_{s1}$ is detected by the interferometer 12 with an accuracy of 0.02 μm. After the reticle stage 1 is drawn to the column 2 by vacuum suction, the position $P_{s2}$ of the projected image of the mark S is again detected using the photoelectronic slits $SL_y$ and $SL_x$. If the positions $P_{s1}$ and $P_{s2}$ are the same, no deviation occurs during vacuum suction. If deviation occurs, the processor obtains a difference $\Delta P_s$ between the positions $P_{s1}$ and $P_{s2}$. The difference $\Delta P_s$ is the alignment error of the reticle R itself, and a position corrected by $\Delta P_s$ ($\Delta P_{sx}$, $\Delta P_{sy}$) with respect to the origin position ($CT_x$, $CT_y$) defined in step 3 may be defined as the origin.

In this manner, the reticle alignment error due to both the drift of the reticle alignment microscope and the deviation occurring when the reticle stage is fixed is corrected, thereby further improving accuracy of the shot arrangement on the mask blank.

We claim:

1. A method for repeatedly stepping a substrate held on a two-dimensionally movable stage relative to a mask placed in a radiation beam to form a image of said mask at different shot areas positioned on said substrate relative to an origin of a two-dimensional coordinate system, comprising the steps of:
   providing a reference mark means on said movable stage at a predetermined position;
   measuring a position of said movable stage when said reference mark means is aligned with a detection center of an alignment optical system provided to observe said substrate through said mask;
   supplying shot data representing positions of said shot areas relative to said origin of said coordinate system;
   aligning said mask with said detection center of said alignment optical system;
   determining a corrected origin of said coordinate system at a corrected position in accordance with the measured position of said movable stage; and
   repeatedly stepping said movable stage in accordance with said shot data to form said shot areas at positions represented by said shot data relative to said corrected origin, respectively.

2. A method according to claim 1, wherein said reference mark means is provided by a fiducial mark formed on said movable stage.

3. A method according to claim 1, further comprising providing said mask with alignment mark means, providing photoelectric detecting means sensitive to an image of said alignment mark means, and detecting a positional relation between said alignment mark means of said mask and said photoelectric detecting means after said step of aligning said mask with said detection center.

4. A method according to claim 3, wherein said corrected origin is determined in accordance with the measured position of said movable stage and the detected positional relation between said alignment mark means and said photoelectric detecting means.

* * * * *